(12) United States Patent
Corisis (10) Patent No.: US 6,765,291 B2
(45) Date of Patent: Jul. 20, 2004

(54) IC PACKAGE WITH DUAL HEAT SPREADERS

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/219,118

(22) Filed: Aug. 14, 2002

(65) Prior Publication Data

US 2002/0185727 A1 Dec. 12, 2002

Related U.S. Application Data

(62) Division of application No. 09/942,178, filed on Aug. 29, 2001, which is a continuation of application No. 09/145,339, filed on Sep. 1, 1998, now Pat. No. 6,326,687.

(51) Int. Cl.[7] .......................... H01L 21/44; H01L 21/48; H01L 21/50

(52) U.S. Cl. .......................... 257/713; 257/686; 257/76; 257/723; 361/709; 361/711; 361/716

(58) Field of Search ................................. 257/712, 713, 257/276, 719, 723, 675, 686, 730, 685, 687, 659, 660, 704–708, 729, 787, 796; 29/830, 856; 361/709, 716, 711

(56) References Cited

U.S. PATENT DOCUMENTS

| | | | |
|---|---|---|---|
| 4,024,570 A | 5/1977 | Hartmann et al. | |
| 4,143,456 A | 3/1979 | Inoue | |
| 4,209,798 A | 6/1980 | Beretta | |
| 4,264,917 A | 4/1981 | Ugon | |
| 4,300,153 A | 11/1981 | Hayakawa et al. | |
| 4,323,914 A | 4/1982 | Berndlmaier et al. | |
| 4,358,552 A | 11/1982 | Shinohara et al. | |
| 4,507,675 A | 3/1985 | Fujii et al. | |
| 4,642,671 A | 2/1987 | Rohsler et al. | |
| 4,688,077 A | 8/1987 | Wakabayashi et al. | |
| 4,801,998 A | 1/1989 | Okuaki | |
| 4,931,852 A | 6/1990 | Brown et al. | |
| 4,961,107 A | 10/1990 | Geist et al. | |
| 5,051,275 A | 9/1991 | Wong | |
| 5,101,465 A | 3/1992 | Murphy | |
| 5,144,747 A | 9/1992 | Eichelberger | |
| 5,173,764 A | 12/1992 | Higgins, III | |
| 5,194,930 A | 3/1993 | Papathomas et al. | |
| 5,214,845 A | 6/1993 | King et al. | |
| 5,233,220 A | 8/1993 | Lamson et al. | |
| 5,279,029 A | 1/1994 | Burns | |
| 5,311,060 A | 5/1994 | Rostoker et al. | |
| 5,349,235 A | 9/1994 | Lee et al. | |
| RE34,794 E | 11/1994 | Farnworth | |
| 5,377,077 A | 12/1994 | Burns | |

(List continued on next page.)

FOREIGN PATENT DOCUMENTS

| | | |
|---|---|---|
| JP | 52-77684 | 6/1977 |
| JP | 60-94744 | 5/1985 |
| JP | 60-178651 | 9/1985 |
| JP | 60-180150 | 9/1985 |
| JP | 63-187652 | 8/1988 |
| JP | 4-157758 | 5/1992 |
| JP | 405074991 | 3/1993 |
| JP | 40-6097365 | 4/1994 |
| JP | 40-6216284 | 8/1994 |

Primary Examiner—David A. Zarneke
(74) Attorney, Agent, or Firm—TraskBritt (57) ABSTRACT

A method of making an integrated circuit device using an encapsulated semiconductor die having leads extending therefrom and attaching a heat spreader to each of the major outer encapsulant surfaces thereof. One or both of the heat spreaders has a pair of end posts configured for allowing further encapsulation of portions thereof and insertion into through-holes in a substrate to position and support the device during and following the outer lead solder reflow step at board assembly. The heat spreaders provide high heat dissipation and EMR shielding, and may be connected to the substrate ground to become ground planes.

62 Claims, 10 Drawing Sheets

U.S. PATENT DOCUMENTS

| | | |
|---|---|---|
| 5,378,924 A | 1/1995 | Liang |
| 5,379,186 A | 1/1995 | Gold et al. |
| 5,379,187 A | 1/1995 | Lee et al. |
| 5,387,554 A | 2/1995 | Liang |
| 5,394,303 A | 2/1995 | Yamaji |
| 5,413,970 A | 5/1995 | Russell |
| 5,420,751 A | 5/1995 | Burns |
| 5,434,105 A | 7/1995 | Liou |
| 5,436,203 A | 7/1995 | Lin |
| 5,446,620 A | 8/1995 | Burns et al. |
| 5,450,283 A | 9/1995 | Lin et al. |
| 5,457,071 A | 10/1995 | Dombroski |
| 5,488,254 A | 1/1996 | Nishimura et al. |
| 5,489,538 A | 2/1996 | Rostoker et al. |
| 5,489,801 A | 2/1996 | Blish, II |
| 5,541,446 A | 7/1996 | Kierse |
| 5,543,664 A | 8/1996 | Burns |
| 5,550,711 A | 8/1996 | Burns et al. |
| 5,552,635 A | 9/1996 | Kim et al. |
| 5,559,306 A | 9/1996 | Mahulikar |
| 5,566,051 A | 10/1996 | Burns |
| 5,592,019 A | 1/1997 | Ueda et al. |
| 5,594,282 A | 1/1997 | Otsuki |
| 5,596,231 A | 1/1997 | Combs |
| 5,598,034 A | 1/1997 | Wakefield |
| 5,619,067 A | 4/1997 | Sua et al. |
| 5,641,997 A | 6/1997 | Ohta et al. |
| 5,656,857 A | 8/1997 | Kishita |
| 5,659,952 A | 8/1997 | Kovac et al. |
| 5,701,034 A | 12/1997 | Marrs |
| 5,815,371 A | 9/1998 | Jeffries et al. |
| 5,828,125 A | 10/1998 | Burns |
| 5,891,759 A | 4/1999 | Otsuki |
| 6,025,642 A | 2/2000 | Burns |
| 6,048,744 A | 4/2000 | Corisis et al. |
| 6,049,123 A | 4/2000 | Burns |
| 6,061,242 A | 5/2000 | Corisis et al. |
| 6,326,687 B1 | 12/2001 | Corisis |
| 6,326,827 B1 | 12/2001 | Cretti et al. |
| 6,418,023 B2 | 7/2002 | Kinsman et al. |

IC PACKAGE WITH DUAL HEAT SPREADERS

CROSS-REFERENCE TO RELATED APPLICATIONS

This application is a divisional of application Ser. No. 09/942,178, filed Aug. 29, 2001, now U.S. Pat. No. 6,518,098, issued Feb. 11, 2003, which is a continuation of application Ser. No. 09/145,339, filed Sept. 1, 1998, now U.S. Pat. No. 6,326,687, issued Dec. 4, 2001.

BACKGROUND OF THE INVENTION

1. Field of the Invention

This invention relates generally to integrated circuit (IC) devices or semiconductor devices. More particularly, the invention pertains to heat spreading apparatus and methods for dissipating heat from integrated circuit devices or semiconductor devices.

2. State of the Art

Integrated circuit semiconductor devices (ICs) or semiconductor devices are devices including small electronic circuits formed on the surface of a wafer of semiconductor material such as silicon. The ICs or semiconductor devices are fabricated in a plurality on the surface or as part of a wafer. The wafer is then subdivided into discrete IC or semiconductor device chips or dice, and then further tested and assembled for customer use through various well-known individual die testing and packaging techniques, including lead frame packaging, Chip-On-Board (COB) packaging, and flip-chip packaging (FCP). Depending upon the size of the IC or semiconductor device and the size of the wafer, a wafer may be divided into a few dice or as many as several hundred or more than one thousand discrete IC or semiconductor device may be subsequently packaged in a variety of manners using lead frames, substrates, etc.

Higher powered, faster integrated circuits and/or semiconductor devices generate heat which, if not dissipated, may overheat the IC and/or semiconductor device, resulting in its failure.

Various means for dissipating heat from ICs and semiconductor devices have been used or proposed. Heat transfer through the metallic leadframe or other conducting wire has been enhanced in different ways, as shown in U.S. Pat. No. 5,541,446 of Kierse, U.S. Pat. No. 4,961,107 of Geist et al., U.S. Pat. No. 5,101,465 of Murphy, U.S. Pat. No. 4,264,917 of Ugon, and U.S. Pat. No. 5,656,857 of Kishita.

U.S. Pat. No. 5,450,283 of Lin et al. discloses a device in which the die surface is left unencapsulated in the packaging step for improved heat dissipation.

Use of an encapsulant composition having enhanced heat conducting properties is shown in U.S. Pat. No. 4,358,552 of Shinohara et al., U.S. Pat. No. 4,507,675 of Fujii et al., U.S. Pat. No. 4,931,852 of Brown et al., and Japanese Patent Application No. 58-202429 of Tanaka. U.S. Pat. No. 5,379,186 of Gold et al. discloses a package comprising inner and outer layers of encapsulant with an intermediate layer of thermally conductive material.

A die support member to which the die is adhesively attached has been used as a heat sink in a variety of configurations. Examples of such are shown in U.S. Pat. No. 5,701,034 of Marrs, U.S. Pat. No. 5,379,187 of Lee et al., U.S. Pat. No. 5,594,282 of Otsuki, U.S. Pat. No. 5,596,231 of Combs, U.S. Pat. No. 5,598,034 of Wakefield, U.S. Pat. No. 4,642,671 of Rohsler et al., U.S. Pat. No. 5,434,105 of Liou, U.S. Pat. No. 5,488,254 of Nishimura et al., U.S. Pat. No. 5,659,952 of Kovak et al., and U.S. Pat. No. 5,489,801 of Blish II.

A single plate of metallic material has been applied to the outside of the package as a heat sink. Such is shown in U.S. Pat. No. 5,552,635 of Kim et al., U.S. Pat. No. 5,173,764 of Higgins III, and U.S. Pat. No. 4,024,570 of Hartmann et al.

In U.S. Pat. Nos. 5,378,924 and 5,387,554 of Liang, a layer of thermal grease is inserted between the die and a heat sink.

U.S. Pat. No. 5,144,747 of Eichelberger, U.S. Pat. No. 5,311,060 of Rostoker et al., and U.S. Pat. No. 5,641,997 of Ohta et al. show IC devices with separate heat sinks within the encapsulant near a wall thereof.

U.S. Pat. No. 4,323,914 of Berndlmaier et al. teaches a heat transfer structure comprising a pool of liquid metal adjacent a parylene-covered die in a semiconductor device.

Various patents show the use of flat and non-flat metal conductors for reducing power-ground loop inductance and increasing capacitance to reduce noise and increase operational speed. See, for example, U.S. Pat. No. 5,214,845 of King et al., U.S. Pat. No. 5,559,306 of Mahulikar, U.S. Pat. No. 5,233,220 of Lamson et al., U.S. Pat. No. 5,436,203 of Lin, and Japanese Application No. 60-178651 of Uno. None of these documents mentions heat dissipation.

The various methods of heat dissipation require, in general, complex structures. Routes for moisture leakage into the package result from heat spreaders/sinks which are partially exposed. A heat spreader construction is needed for producing an integrated circuit device with high heat removal rates and protection against electronic noise and spikes, all at low cost and minimum time expenditure, and without problems of leakage.

BRIEF SUMMARY OF THE INVENTION

The invention comprises a vertical mount integrated circuit (IC) or semiconductor device with dual heat spreaders. The planar heat spreaders are adhesively attached to the opposed major surfaces of the package encapsulant. One or both of the heat spreaders has one or more through-hole posts projecting outwardly to be inserted into through-holes in a substrate. When inserted, the posts align the exterior leads of the device with corresponding leads on the substrate for accurate bonding therebetween. One or both of the heat spreaders may be connected to a ground bus to act as a ground plane.

The heat spreaders of the invention provide enhanced heat dissipation, shielding of the integrated circuit(s) of the IC and/or semiconductor device, and mitigation of transient voltage excursions. The invention is particularly applicable to a vertical mount package which is to be bonded by solder reflow to a substrate such as a circuit board.

BRIEF DESCRIPTION OF THE DRAWINGS

The invention is illustrated in the following exemplary figures, wherein the drawings are not necessarily to scale.

DESCRIPTION OF THE ILLUSTRATED EMBODIMENTS

Figure 1:
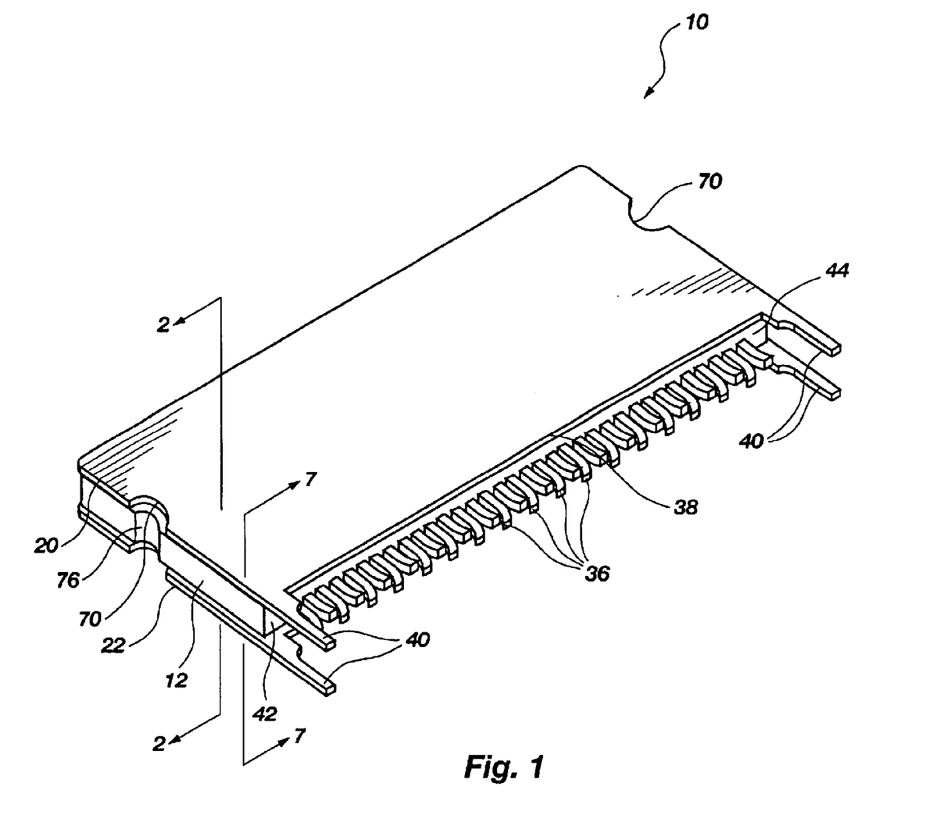
FIG. 1 is a perspective view of a vertical mount IC or semiconductor device having dual heat spreaders of the invention.

One embodiment of the invention is illustrated in drawing FIGS. 1 through 3 and described as follows:

The invention comprises an IC or semiconductor device 10 with dual heat spreaders 20, 22, where the heat spreaders "sandwich" the encapsulation material 12 of the IC or semiconductor device. Each heat spreader 20, 22 is fixed to one of the major external surfaces 14, 16 of the encapsulation material 12, and substantially overcovers the major external surface.

In a preferred form, the heat spreaders 20, 22 are joined to the planar major external surfaces 14, 16 of the encapsulation material 12 with an adhesive material 18. Preferably, the adhesive material 18 has a relatively high coefficient of thermal conductivity and comprises a thin layer. It is also preferable that the adhesive material 18 has a coefficient of thermal expansion (CTE) intermediate between the CTEs of the encapsulation material 12 and the heat spreaders 20, 22. In another preferred form, the adhesive material 18 has a relatively high degree of elasticity to compensate for differences between heat spreader CTE and encapsulant CTE. An adhesive coated tape formed of e.g. polyimide may be used as adhesive material 18 to join the heat spreaders 20, 22 to the encapsulation material 12.

Figure 2:
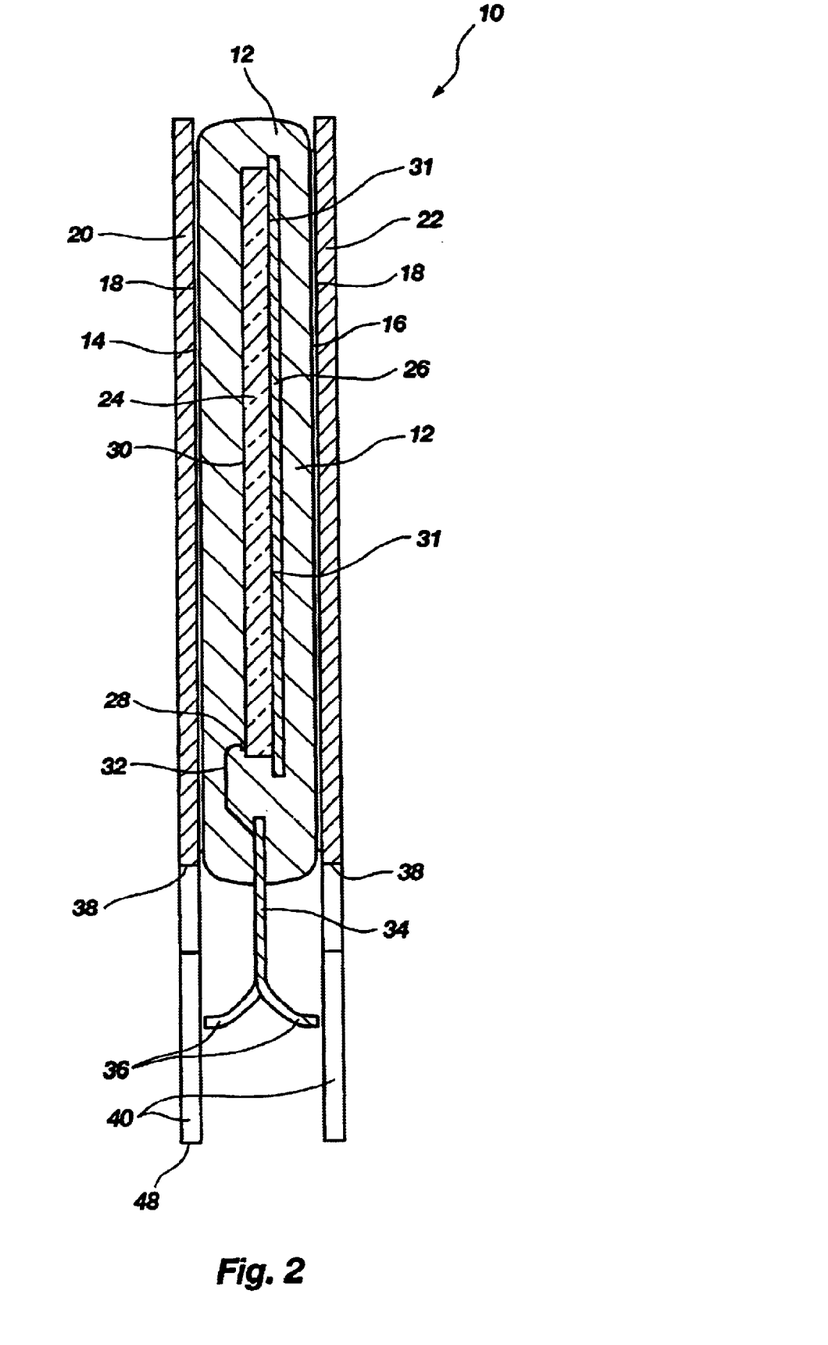
FIG. 2 is a cross-sectional view of an IC or semiconductor device of the inventions as taken along line 2—2 of FIG. 1.

An exemplary IC or semiconductor device 10 is depicted in drawing FIG. 2, being based on an integrated circuit die 24 which has its reverse side 31 down-bonded to a lead frame paddle 26. Electrical bond pads 28 on one end of the active surface 30 of die 24 are bonded by conductive wires 32 to lead fingers 34 whose outer ends comprise exterior leads 36 to be connected to conductors on a substrate (not shown in drawing FIGS. 1–3). Both the active surface 30 and the reverse side 31 comprise generally parallel major surfaces of the die 24.

As will become apparent from the description, the application of heat spreaders in accordance with the invention may be accomplished regardless of the particular IC or semiconductor device configuration.

As shown in drawing FIGS. 1–3 and 7, the heat spreaders 20, 22 are thin planar members or plates formed to substantially overcover the package of encapsulation material 12. A pair of through-hole posts 40 is formed as part of each heat spreader 20, 22, spaced along what will be known herein as the lead edge 38 of the heat spreader. The lead edge 38 is defined as the heat spreader edge proximate the exterior leads 36 of the package. As shown in the figures, the through-hole posts 40 extend outward from each heat spreader 20, 22 at each end 42, 44 of the lead edge 38. The through-hole posts 40 may be located at any location along an edge of the heat spreader 20, 22 where their insertion into a through-hole 60 in a substrate 50 or other body will accurately position and hold the IC or semiconductor device 10 in place for joining the exterior leads 36 to other leads, for example, by solder reflow to surface conductive traces 52 of a substrate 50. Alternately, as illustrated in drawing FIG. 2A, the through-hole posts 40 extend downwardly and outwardly from each heat spreader 20, 22 at each end 42, 44 of the lead edge 38 for connection to a suitable substrate (not shown) by adhesive bonding, reflow soldering, etc. In these drawings, the substrate 50 is exemplified as a circuit board with a thickness 56 and with surface conductive traces 52 on its upper surface 54. In the substrate 50, through-holes 60 are positioned relative to the surface conductive traces 52 so that precise positioning (and maintenance of the position) of the IC device 10 for lead attachment is readily accomplished.

The through-holes 60 are most easily formed by drilling. The hole diameter 62 is based on the size of the through-hole posts 40, permitting a snug or interference fit therebetween. The minimum cross-sectional dimensions of the through-hole posts 40 depend upon the strength of the heat spreader material. Once the IC device 10 is attached to the substrate 50, the presence of the through-hole posts 40 adds much stability. If desired, additional stability may be attained by inserting a fast curing adhesive material 64 into the through-holes 60 surrounding the through-hole posts 40. The adhesive material 64 may be any of a wide variety of organic adhesives, as known in the art. A similar type adhesive material 64 may be used to bond through-hole posts 40, as illustrated in drawing FIG. 2A, to the substrate 50 to attach the through-hole posts 40 thereto.

Figure 2A:
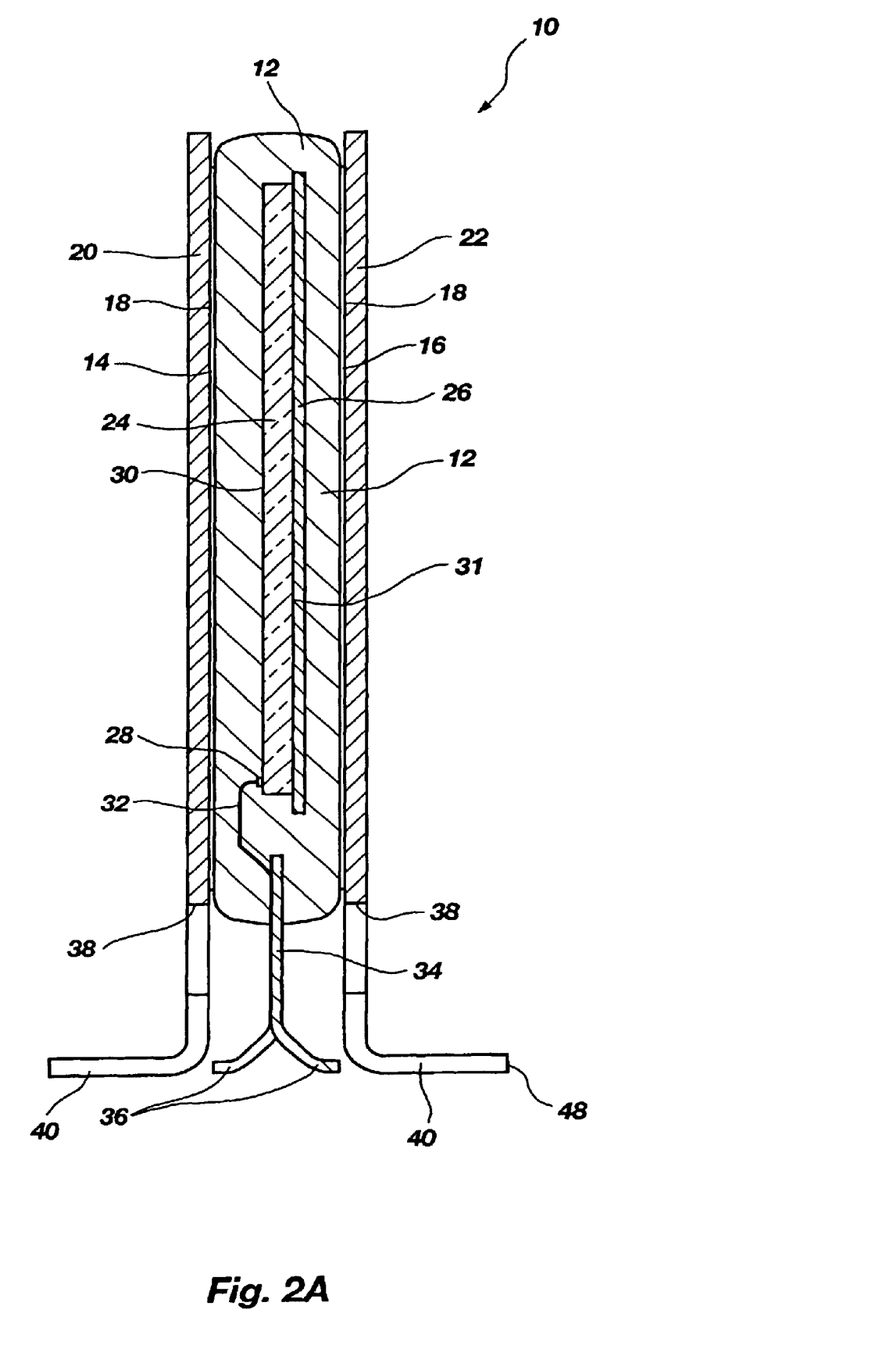
FIG. 2A is a cross-sectional view of a second embodiment of an IC or semiconductor device of the invention, as if taken along line 2—2 of FIG. 1.

Referring to drawing FIG. 2A, an alternative IC or semiconductor device 10 is depicted such as in drawing FIG. 2, being based on an integrated circuit die 24 which has its reverse side 31 down-bonded to a lead frame paddle 26. Electrical bond pads 28 on one end of the active surface 30 of die 24 are bonded by conductive wires 32 to lead fingers 34 whose outer ends comprise exterior leads 36 to be connected to conductors on a substrate (not shown in drawing FIGS. 1–3). Both the active surface 30 and the reverse side 31 comprise generally parallel major surfaces of the die 24.

As shown in drawing FIGS. 1–3 and 7A, the heat spreaders 20, 22 are thin planar members or plates formed to substantially overcover the package of encapsulation material 12. A pair of through-hole posts 40 is formed as part of each heat spreader 20, 22, spaced along what will be known herein as the lead edge 38 of the heat spreader. The lead edge 38 is defined as the heat spreader edge proximate the exterior leads 36 of the package. As shown in the figures, the through-hole posts 40 extend downwardly and outwardly away from each heat spreader 20, 22 at each end 42, 44 of the lead edge 38. The through-hole posts 40 may be located at any location along an edge of the heat spreader 20, 22 where they are available for subsequent mounting on a substrate 50 or other body which will accurately position and hold the IC or semiconductor device 10 in place to a substrate 50 or for joining the external leads 36 to other leads, for example, by solder reflow to surface conductive traces 52 and circuit 78 of a substrate 50. In these drawings, the substrate 50 is exemplified as a circuit board which may include surface conductive traces 52 and circuit 78 on its upper surface 54.

Figure 3:
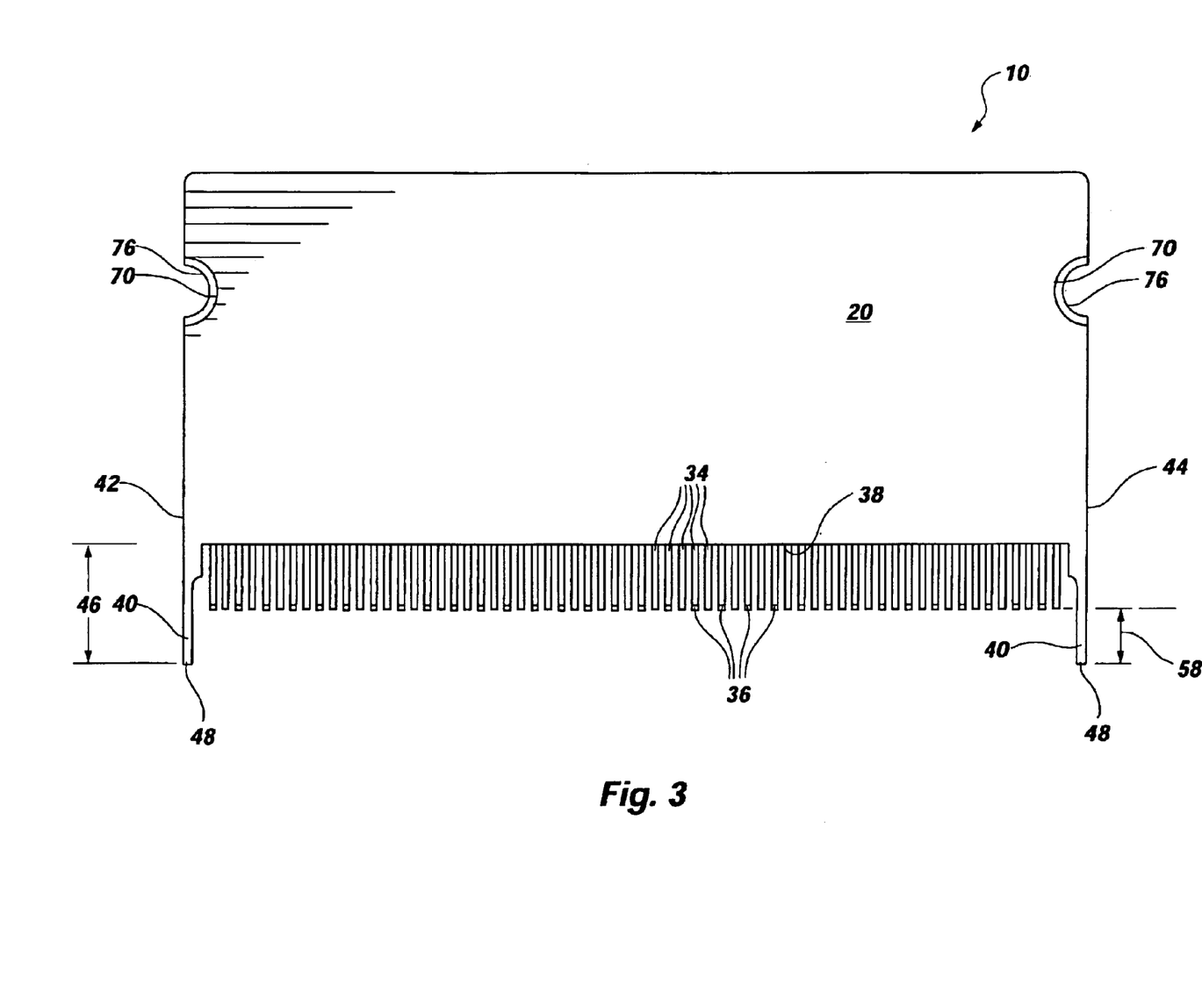
FIG. 3 is a plan view of an IC or semiconductor device of the invention.
Figure 7:
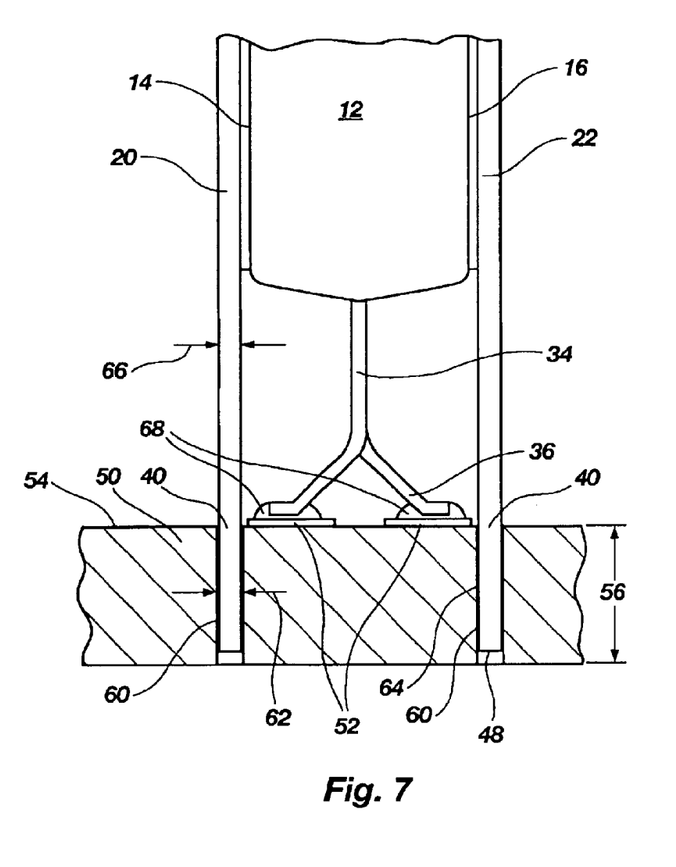
FIG. 7 is a partial cross-sectional view of an IC or semiconductor device of the invention mounted on a substrate as taken along line 7—7 of FIG. 1.
Figure 7A:
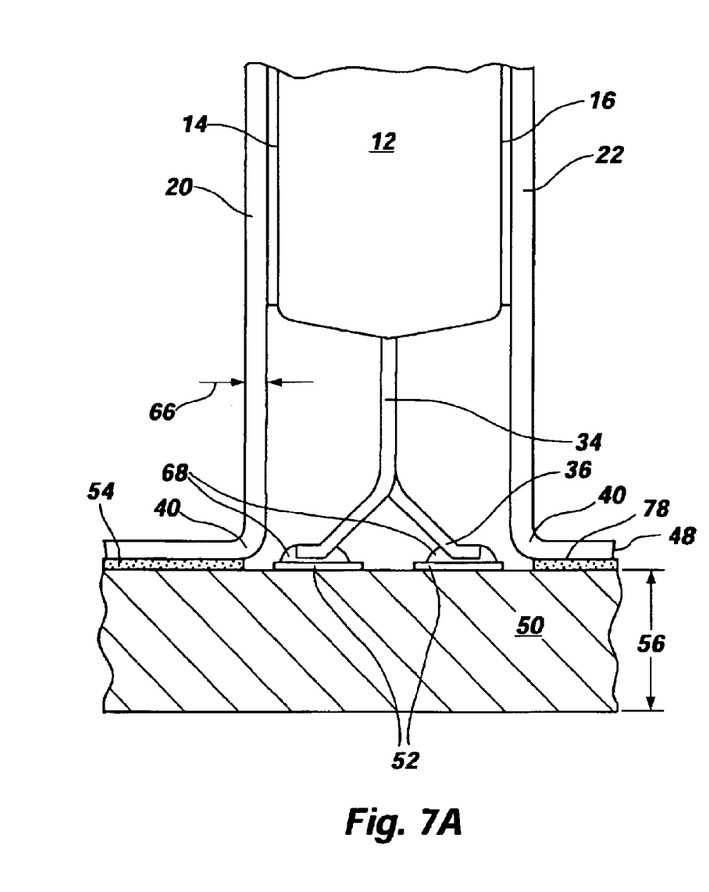
FIG. 7A is a partial cross-sectional view of an IC or semiconductor device of a second embodiment of the invention mounted on a substrate if the cross-section of such invention were taken along line 7—7 of FIG. 1.

As shown in drawing FIG. 3, the through-hole posts 40 may be made of a length 46 such that the post ends 48 extend completely along a desired length 58 of the substrate 50, as shown in FIGS. 2A and 7A.

The through-hole posts 40 may be of any cross-sectional shape or thickness suitable for use on the substrate 50. Typically, the through-hole posts 40 are formed to have a square or near-square cross-section having a maximum dimension approximately equal to the thickness 66 of the heat spreader 20 (as shown in 7 and 7A).

In FIG. 7, the exterior leads 36 are shown bonded by reflow of solder 68 to surface conductive traces 52 on the upper surface 54 of the substrate 50.

Referring to drawing FIG. 7A, a lower portion of a through-hole post 40 is bonded to a lead or circuit 78 on the substrate 50 while the other through-hole post 40 is adhesively secured to the surface of the substrate 50. If desired, both through-hole posts 40 may be reflow soldered to circuits 78 on substrate 50 or both adhesively bonded to the surface of the substrate 50.

Referring back to FIGS. 1 and 3, the heat spreaders 20, 22 are shown with semicircular cutouts 70 which together comprise means for precisely registering the spreaders on the encapsulation material 12. They are shown on each heat spreader 20, 22 as semicircular cutouts aligned with cutouts 76 in the encapsulation material 12. The cutouts 70 permit the use of automated machinery for heat spreader placement. The particular registration means may vary, depending upon the particular manipulation apparatus which is used.

Figure 4:
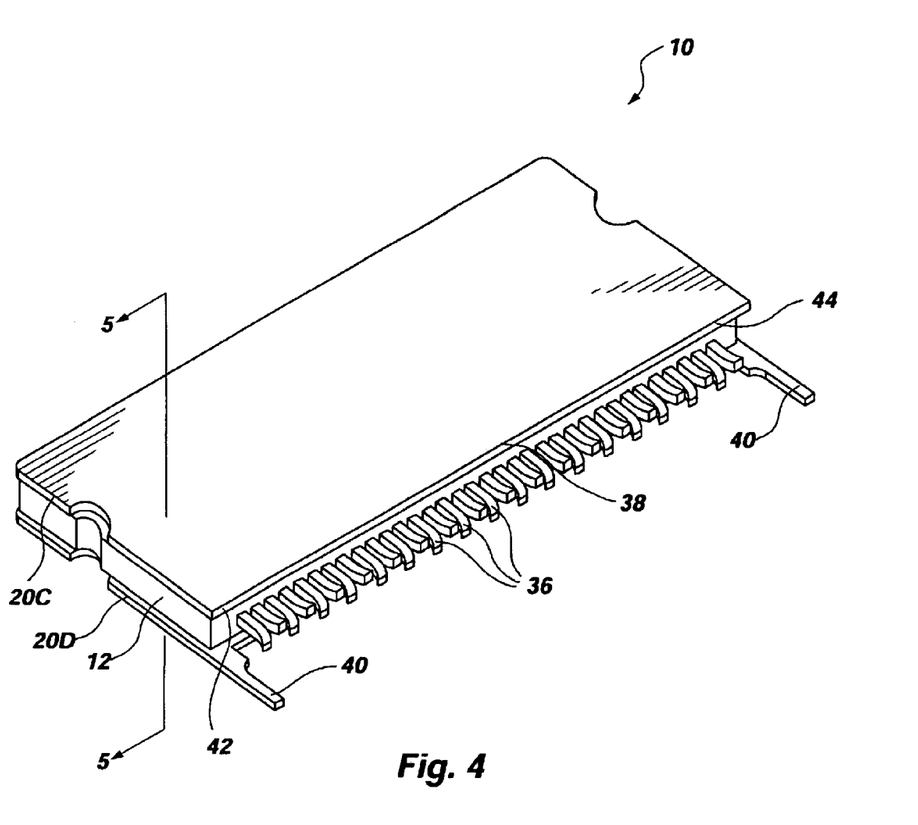
FIG. 4 is a perspective view of a vertical mount IC or semiconductor device having another embodiment of dual heat spreaders of the invention.
Figure 5:
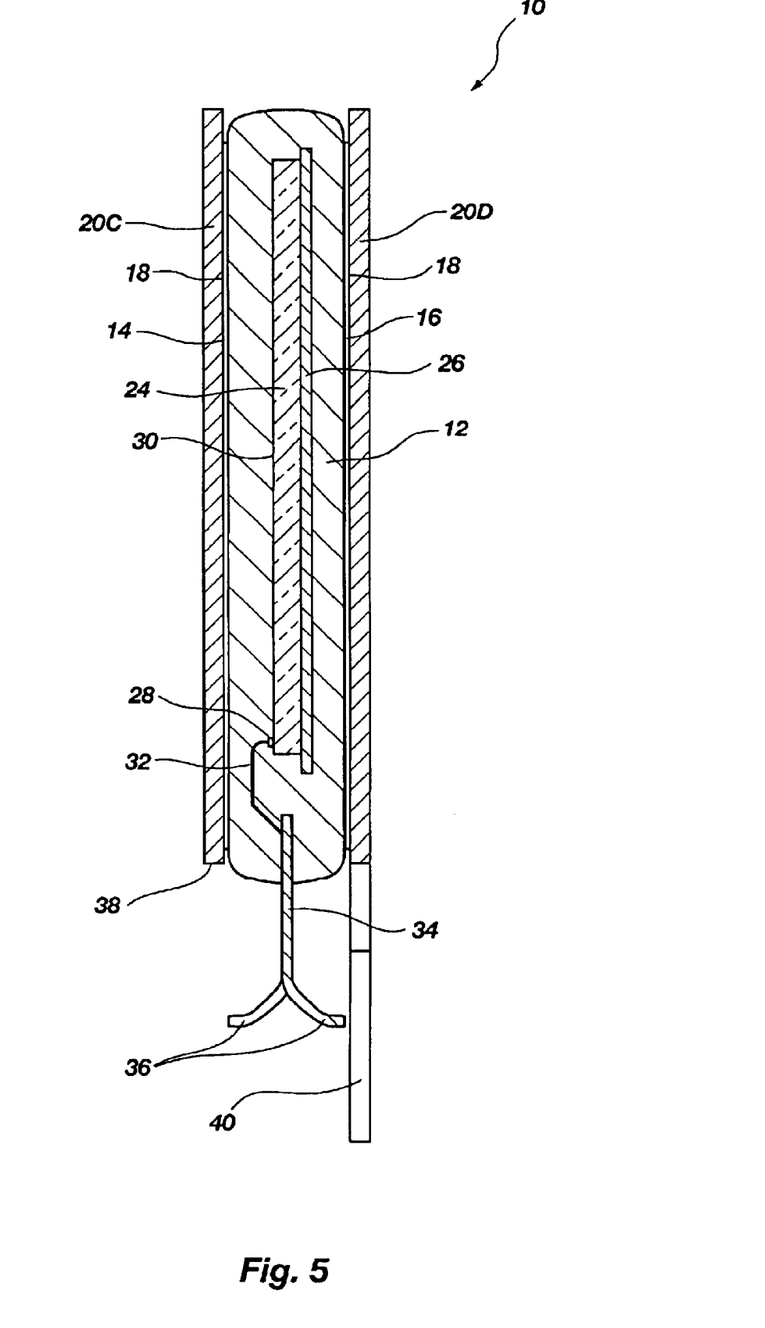
FIG. 5 is a cross-sectional view of another embodiment of an IC or semiconductor device of the invention, as taken along line 5—5 of FIG. 4.

Turning now to FIGS. 4 and 5, another form of the invention is shown as having a pair of heat spreaders. A first heat spreader 20C is formed with no through-hole posts 40, while a second heat spreader 20D has two end-positioned through-hole posts 40. Thus, the completed IC device 10 has two through-hole posts 40, one at each end 42, 44 of the lead edge 38. Only two through-holes 60 in the substrate 50 are needed to accurately position the IC device 10 thereon for lead attachment.

Figure 6:
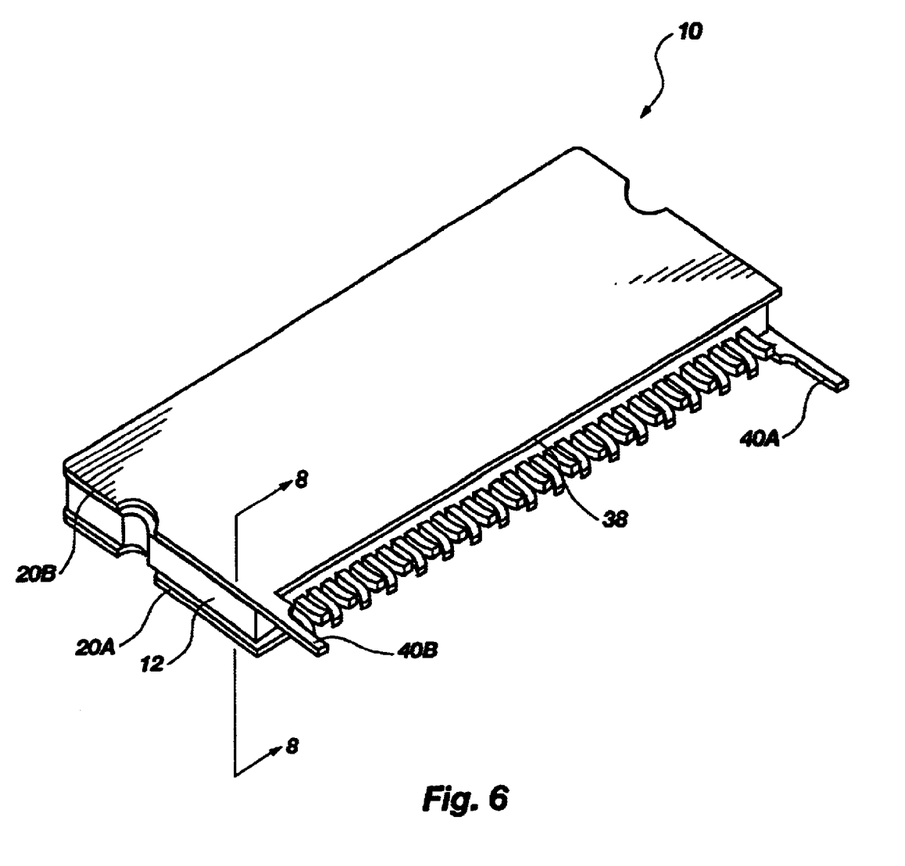
FIG. 6 is a perspective view of a vertical mount IC or semiconductor device having another embodiment of dual heat spreaders of the invention.
Figure 8:
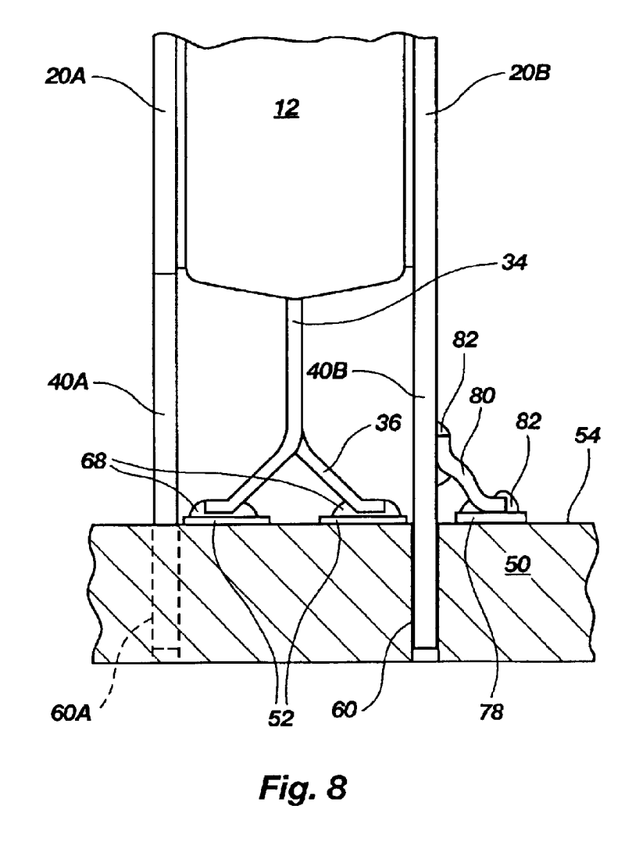
FIG. 8 is a partial cross-sectional view of another IC or semiconductor device of the invention mounted on a substrate, as taken along line 8—8 of FIG. 6.

A further form of the IC device 10 is depicted in FIGS. 6 and 8, where each heat spreader 20A, 20B has one through-hole post 40A, 40B, respectively. The two heat spreaders 20A, 20B are in fact identical, but are in an inverse position relative to each other. Like the embodiment of FIG. 4, only two through-holes 60, 60A are required in the substrate 50 to mount the IC device 10.

In FIG. 8, the exterior leads 36 are shown bonded by reflow of solder 68 to surface conductive traces 52 on the upper surface 54 of the substrate 50.

As shown in FIG. 8, one of the heat spreaders, i.e. 20B, is configured as a ground plane by e.g. connecting it to a ground lead or circuit 78 with a conductor 80 with solder connections 82.

Figure 8A:
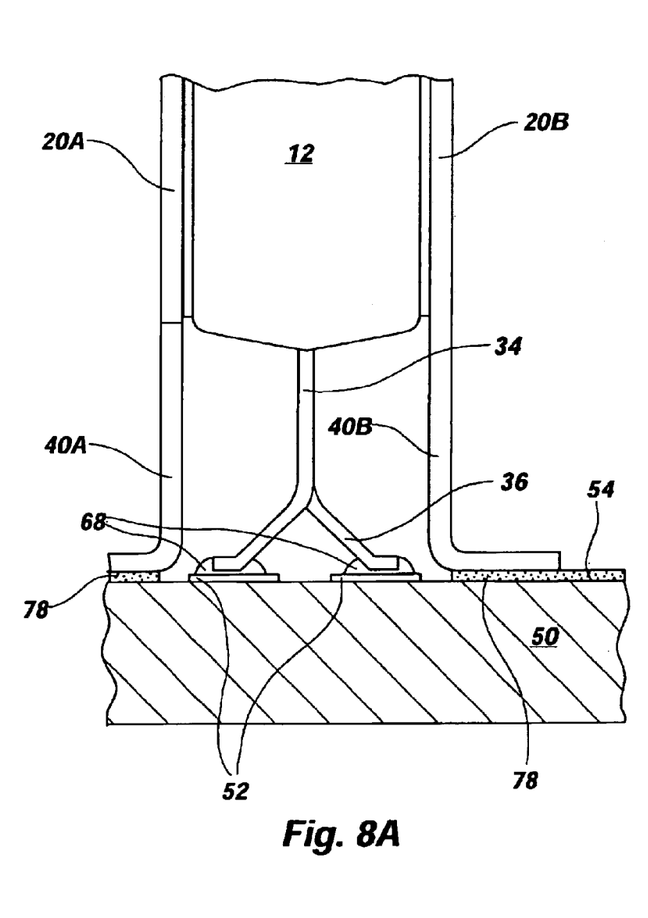
FIG. 8A is a partial cross-sectional view of another IC or semiconductor device of the second embodiment of the invention mounted on a substrate, as taken along line 8—8 of FIG. 6.

In drawing FIG. 8A, the exterior leads 36 are shown bonded by reflow of solder 68 to surface conductive traces 52 on the upper surface 54 of the substrate 50 while heat spreaders 20A and 20B are shown bonded by reflow of solder 68 to leads or circuits 78 on substrate 50, thereby allowing the use of the heat spreaders 20A and 20B as ground planes when the leads or circuits 78 are grounded.

In each of the embodiments, the heat spreaders 20, 22 may be formed of various materials including a metal such as aluminum or a copper alloy, a metal filled polymer having enhanced heat conductivity, or a ceramic, for example. The preferred material is a metal because of its resistance to breakage and high heat conductivity. Thus, the through-hole posts 40 may have smaller dimensions and the through-holes 60 may have a smaller diameter. The thickness 66 of the heat spreaders 20 may be any suitable thickness for use as a heat spreader.

Figure 9:
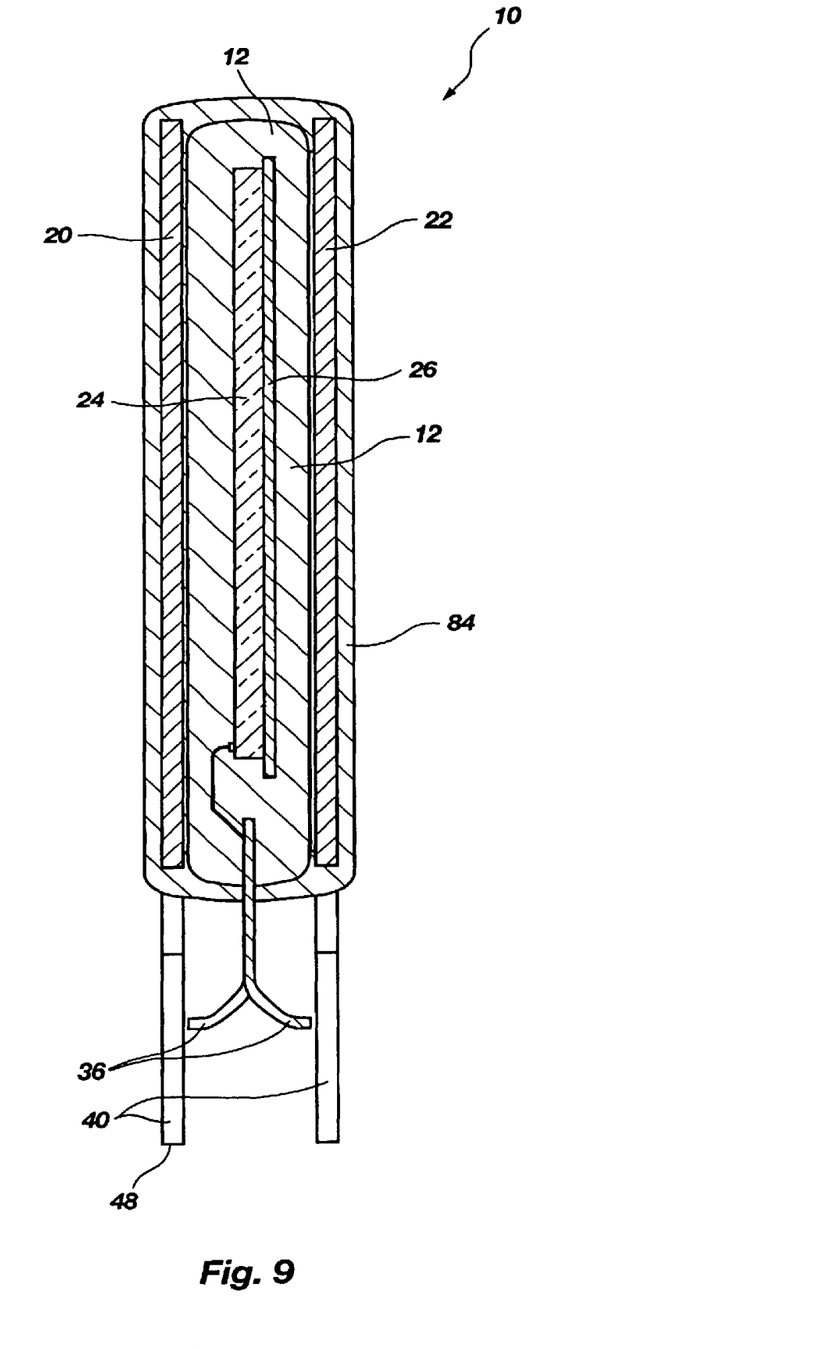
FIG. 9 is a cross-sectional view of an IC or semiconductor device of the invention having encapsulated heat spreaders.

If desired, the device 10 may be encapsulated a second time, following bonding of the heat spreaders 20, 22 to the initial encapsulation material 12. As shown in FIG. 9, the second layer 84 of encapsulant will enclose a major portion of each heat spreader 20, 22, whereby only the exterior leads 36 and the through-hole posts 40 project from the encapsulant. The second layer 84 of encapsulant may be the same as, or different from, the encapsulation material 12 of the first encapsulation step. This second encapsulation step may comprise injection in a mold, for example, or simply overlaying an encapsulant on the surface, since there are no interior spaces into which encapsulant must be injected.

The advantages of the IC device 10 as described are many. First, the dissipation rate of thermal energy is very high. The heat spreaders 20, 22 provide a high degree of protection of the IC device 10 during reflow connection of the exterior leads 36 to a substrate 50.

Second, precise positioning of the IC device 10 for attachment to a substrate is made easier and consistent by use of the through-hole posts 40. Two or less through-holes 60 may be used to provide accurate bonding.

Third, the post-bond stability of the IC device 10 on the substrate 50 is increased, lessening the possibility of damage to the device. The stability may be further enhanced by simple application of an adhesive, reflow solder, etc.

Fourth, the heat spreaders 20, 22 may be easily connected to a ground bus to provide a ground plane or planes for the device. The effects of transient voltage excursions are reduced or eliminated.

Fifth, shielding of the device by metal heat spreaders 20, 22 also provides protection from lead inductance effects.

The heat spreaders are easily formed and easily applied to the device, using readily available materials. Their use does not introduce leakage paths by which destructive moisture and gases may penetrate the interior of the package.

Additional advantages and modifications will readily be recognized by those skilled in the art. Therefore, the invention in its broader aspects is not limited to the specific details, and representative devices, shown and described herein. Accordingly, various modifications may be made without departing from the spirit or scope of the general inventive concept and embodiments as defined by the appended claims and their equivalents.

What is claimed is:

1. A semiconductor device package, comprising:
 a semiconductor die having electrical leads connected thereto, the semiconductor die encapsulated in a material forming a package, the package having opposing major external surfaces and having a package edge connecting the opposing major external surfaces and a portion of the electrical leads connected to the semiconductor die extending from the package edge, lead ends of the portion of the electrical leads for connection to a substrate, the package configured with register apparatus comprising a recess in at least one peripheral edge of the package, the recess extending to each of the opposing major external surfaces, the electrical leads for vertical mounting of the semiconductor die on the substrate; and two heat spreaders, each of the two heat spreaders contacting at least a portion of the substrate, the two heat spreaders having a portion thereof attached to a portion of one of the opposing major external surfaces of the semiconductor die, thereby containing the semiconductor die between a portion of the two heat spreaders, the two heat spreaders configured to provide essentially a sole structural support for at least one of the electrical leads, the two heat spreaders positioned so as to provide an opening between distal end portions thereof, the two heat spreaders each comprising register apparatus on at least one peripheral edge thereof for alignment with the register apparatus of the package.

2. The semiconductor device package of claim 1, wherein at least one of the two heat spreaders has at least one through-hole post extending outwardly beyond the lead ends for connection to the substrate.

3. The semiconductor device package of claim 2, wherein one of the two heat spreaders has a through-hole post proximate each end of the semiconductor die for connection to the substrate, the substrate having apertures therein.

4. The semiconductor device package of claim 2, wherein a first heat spreader of the two heat spreaders has the at least one post proximate a first end of the semiconductor die, and a second heat spreader of the two heat speaders has the at least one post proximate a second, opposite end of the semiconductor die.

5. The semiconductor device package of claim 1, wherein each of the two heat spreaders substantially covers the attached portion of the one of the opposing major external surfaces of the semiconductor die.

6. The semiconductor device package of claim 1, wherein at least one of the two heat spreaders includes use for connecting to a ground conductor on the substrate.

7. The semiconductor device package of claim 1, wherein the package comprises a vertical mount plastic-encapsulated package.

8. The semiconductor device package of claim 1, wherein the register apparatus on the at least one peripheral edge of each of the two heat spreaders includes use for machine positioning and attachment of each heat spreader on one of the opposing major external surfaces of the package.

9. The semiconductor device package of claim 8, wherein the register apparatus on the at least one peripheral edge of each of the two heat spreaders comprises cutout portions of each of the two heat spreaders.

10. The semiconductor device package of claim 1, wherein the two heat spreaders are attached to the package with an adhesive.

11. The semiconductor device package of claim 1, wherein the two heat spreaders are attached to the package with an adhesive-coated tape.

12. The semiconductor device package of claim 1, wherein the two heat spreaders comprise plates, the plates including metal, ceramic material, and plastic material.

13. The semiconductor device package of claim 1, further comprising:
a layer of material for encapsulating the two heat spreaders within the package.

14. A semiconductor device, comprising:
a semiconductor die encapsulated in material forming a package having two opposing major external surfaces and having a package edge connecting the two opposing major external surfaces and electrical leads extending therefrom, lead ends of the electrical leads for attachment to a substrate, the electrical leads for vertical mounting of the semiconductor die on the substrate, the package having register apparatus comprising a recess in at least one peripheral edge of the package, the recess extending to each of the two opposing major external surfaces; and
two heat spreaders, each heat spreader having a surface attached to one of the two opposing major external surfaces of the package, the each heat spreader contacting at least a portion of the substrate, the package sandwiched between the two heat spreaders, the two heat spreaders configured to provide essentially the sole structural support for at least one of the electrical leads, the two heat spreaders positioned so as to provide an opening between end portions thereof, the two heat spreaders each comprising register apparatus on at least one peripheral edge thereof for alignment with the register apparatus of the package.

15. The semiconductor device of claim 14, wherein at least one of the two heat spreaders has at least one post extending beyond the lead ends for attachment to the substrate.

16. The semiconductor device of claim 15, wherein one of the two heat spreaders has a post proximate each end of the semiconductor die.

17. The semiconductor device of claim 15, wherein a first heat spreader of the two heat spreaders has the at least one post proximate a first end of the semiconductor die, and a second heat spreader of the two heat spreaders has the at least one post proximate a second, opposite end of the semiconductor die.

18. The semiconductor device of claim 14, wherein each of the two heat spreaders substantially covers one of the attached two opposing major external surfaces of the package.

19. The semiconductor device of claim 14, wherein at least one of the two heat spreaders is configured for attachment to a conductor on the substrate.

20. The semiconductor device of claim 14, wherein the package comprises a vertical mount plastic-encapsulated package.

21. The semiconductor device of claim 14, wherein the register apparatus on the at least one peripheral edge of each of the two heat spreaders is configured for machine positioning and attachment of each heat spreader on one of the two opposing major external surfaces.

22. The semiconductor device of claim 21, wherein the register apparatus comprises cutout portions of each of the heat spreaders.

23. The semiconductor device of claim 14, wherein the two heat spreaders are attached to the package with an adhesive.

24. The semiconductor device of claim 14, wherein the two heat spreaders are attached to the package with an adhesive-coated tape.

25. The semiconductor device of claim 14, wherein the two heat spreaders comprise plates, the plates including metal, ceramic material, and plastic material.

26. The semiconductor device of claim 14, further comprising:
a layer of material for encapsulating the two heat spreaders within the package.

27. A vertical mount semiconductor package, comprising:
a semiconductor die having opposed major surfaces and circuits formed on one of the opposed major surfaces;
a die support member attached to another of the opposed major surfaces of the semiconductor die;
conductive outer leads along one edge of the semiconductor die between the opposed major surfaces for attachment to a substrate;

conductive lead members connecting the circuits to the conductive outer leads;

a material encapsulating portions of the semiconductor die, the die support member, and the conductive lead members, the material forming a package, the package having register apparatus comprising a recess in at least one peripheral edge of the package, the recess extending to each of the opposed major surfaces; and thermally conductive plates comprising heat spreaders attached to the material being secured thereto, each of the heat spreaders contacting at least a portion of the substrate, each of the heat spreaders covering a portion of the material encapsulating the portions of the semiconductor die and configured to provide essentially a sole structural support for at least one of the conductive outer leads, the heat spreaders positioned so as to provide an opening between distal end portions thereof, the heat spreaders comprising register apparatus on at least one peripheral edge of each of the heat spreaders for alignment with the register apparatus of the package and for machine positioning and attachment of the heat spreaders on the opposed major surfaces of the package.

28. The vertical mount semiconductor package of claim 27, wherein the heat spreaders are secured to the material encapsulating the portions of the semiconductor die.

29. The vertical mount semiconductor package of claim 27, wherein the heat spreaders are adhesively secured to the material encapsulating the portions of the semiconductor die.

30. The vertical mount semiconductor package of claim 27, wherein the heat spreaders are secured to the material encapsulating the portions of the semiconductor die by an adhesive-coated tape.

31. The vertical mount semiconductor package of claim 27, further comprising:
a layer of material for covering a portion of the heat spreaders.

32. A vertical mount semiconductor package, comprising:
a semiconductor die having opposed major surfaces and circuits formed on one of the opposed major surfaces;
a die support member attached to another of the opposed major surfaces of the semiconductor die;
conductive outer leads along one edge of the semiconductor die between the opposed major surfaces for attachment to a substrate;
conductive lead members connecting the circuits to the conductive outer leads;
material encapsulating the semiconductor die, the die support member and the conductive lead members, the material forming a package, the package having a recess in at least one peripheral edge of the package for a register, the recess extending to each of the opposed major surfaces; and
thermally conductive plates comprising heat spreaders attached and secured to portion of the material encapsulating the semiconductor die and substantially covering the opposed major surfaces of the semiconductor die, the heat spreaders configured to provide essentially a sole structural support for at least one of the conductive outer leads, the heat spreaders positioned so as to provide an opening between distal end portions thereof, the heat spreaders comprising register apparatus on at least one peripheral edge of each of the heat spreaders for alignment with the register apparatus of the package.

33. The vertical mount semiconductor package of claim 32, wherein the heat spreaders are secured to the material encapsulating the semiconductor die.

34. The vertical mount semiconductor package of claim 32, wherein the heat spreaders are secured to the material encapsulating the semiconductor die by an adhesive material.

35. The vertical mount semiconductor package of claim 32, wherein the heat spreaders are secured to the material encapsulating the semiconductor die by an adhesive-coated tape.

36. The vertical mount semiconductor package of claim 32, further comprising:
a layer of material securing the heat spreaders to the material encapsulating the semiconductor die.

37. A heat spreader apparatus for an encapsulated semiconductor device having a row of exterior leads, a peripheral edge and at least two opposed major surfaces, the encapsulated semiconductor device having a register apparatus in the peripheral edge thereof, comprising:
a plate forming a first heat spreader for covering a portion of one of the at least two opposed major surfaces of the encapsulated semiconductor device, the first heat spreader having a lead edge proximate to the row of exterior leads having at least one post projecting therefrom for securing the encapsulated semiconductor device to a substrate having at least one circuit thereon, the first heat spreader comprising register apparatus on at least one peripheral edge thereof for accurate mounting to one of the at least two opposed major surfaces; and
another plate forming a second heat spreader for covering a portion of a second one of the at least two opposed major surfaces of the encapsulated semiconductor device, the second heat spreader having a lead edge proximate to the row of exterior leads having at least one post projecting therefrom for securing the encapsulated semiconductor device to the substrate having the at least one circuit thereon, the second heat spreader comprising register apparatus on at least one peripheral edge thereof for accurate mounting to the portion of second one of the at least two opposed major surfaces, each of the register apparatus of the first heat spreader and the second heat spreader aligned with the register apparatus of the encapsulated semiconductor device to form a recess extending into the at least two opposed major surfaces and each of the first heat spreader and the second heat spreader, the first heat spreader and the second heat spreader for providing essentially a sole structural support for at least one of the row of exterior leads, the first heat spreader and the second heat spreader are positioned so as to provide an opening between distal end portions of the first heat spreader and the second heat spreader and the at least one post aligning the row of exterior leads with the at least one circuit on the substrate.

38. The heat spreader apparatus of claim 37, wherein the first heat spreader and the second heat spreader are identical in shape for inverse attachment to the at least two opposed major surfaces.

39. The heat spreader apparatus of claim 38, wherein the at least one post is positioned adjacent one end on each of the first heat spreader and the second heat spreader.

40. The heat spreader apparatus of claim 38, wherein the first heat spreader has two posts projecting therefrom and the second heat spreader has no through-hole posts.

41. The heat spreader apparatus of claim 37, wherein the plates are comprised of metal, a metal filled polymer material, and a ceramic material.

42. The heat spreader apparatus of claim 37, wherein the register apparatus on the at least one peripheral edge of each of the first heat spreader and the second heat spreader is configured for machine positioning and attachment to one of the at least two opposed major surfaces.

43. A heat spreader apparatus for an encapsulated semiconductor device having a row of exterior leads, a peripheral edge and two opposed major surfaces, the encapsulated semiconductor device having a register apparatus in the peripheral edge thereof, comprising:

a plate of heat conductive material cut to form two heat spreaders for substantially covering each of the two opposed major surfaces of the encapsulated semiconductor device, each of the two heat spreaders having a lead edge proximate to the row of exterior leads, the two heat spreaders having at least two posts projecting therefrom for attachment to a substrate and aligning the row of exterior leads with respect to the substrate, the two heat spreaders configured to provide essentially the sole structural support for at least one of the row of exterior leads, the two heat spreaders comprising register apparatus on at least one peripheral edge thereof for accurate mounting to the two opposed major surfaces, each of the register apparatus of the two heat spreaders aligned with the register apparatus of the encapsulated semiconductor device to form a recess extending into the two opposed major surfaces and each of the two heat spreaders, the two heat spreaders positioned for providing an opening therebetween.

44. The heat spreader apparatus of claim 43, wherein each of the two heat spreaders has two posts projecting therefrom.

45. The heat spreader apparatus of claim 43, wherein each of the two heat spreaders has one post projecting therefrom.

46. The heat spreader apparatus of claim 44, wherein each of the two heat spreaders is similar in shape for inverse attachment to one of the two opposed major surfaces.

47. The heat spreader apparatus of claim 43, wherein one of the at least two posts is positioned adjacent an end of the two heat spreaders.

48. The heat spreader apparatus of claim 43, wherein one of the two heat spreaders has two posts projecting therefrom and the other of the two heat spreaders has no through-hole posts.

49. The heat spreader apparatus of claim 43, wherein the plate comprises one of metal, metal filled polymer material, and ceramic material.

50. The heat spreader apparatus of claim 43, wherein the register apparatus formed on each of the two heat spreaders is configured for machine positioning and attachment of the two heat spreaders to the two opposed major surfaces.

51. A semiconductor device package, comprising:

a semiconductor die having electrical leads connected thereto, the semiconductor die encapsulated in a material forming a package, the package having opposing major external surfaces and having four minor edge surfaces connecting the opposing major external surfaces, the package configured with register apparatus comprising a recess in at least one peripheral edge of the package, the recess extending to each of the opposing major external surfaces;

a portion of the electrical leads connected to the semiconductor die extending from one of the four minor edge surfaces, lead ends of the portion of the electrical leads being configured for connection to a substrate, the electrical leads for vertical mounting of the semiconductor die on the substrate, and at least one of the two heat spreaders having at least one through-hole post extending outwardly beyond the lead ends for connection to the substrate, the four minor edge surfaces having no heat dissipating structures;

two heat spreaders, each heat spreader having a portion thereof attached to a portion of one of the opposing major external surfaces of the semiconductor die, thereby containing the semiconductor die between a portion of the two heat spreaders, the two heat spreaders configured to provide essentially a sole structural support for at least one of the electrical leads, the two heat spreaders positioned so as to provide an opening between distal end portions of the two heat spreaders, the two heat spreaders comprising register apparatus on at least one peripheral edge of each of the heat spreaders for alignment with the register apparatus of the package.

52. The semiconductor device package of claim 51, wherein one of the two heat spreaders has a through-hole post proximate each end of the semiconductor die for connection to the substrate, the substrate having apertures therein.

53. The semiconductor device package of claim 51, wherein a first heat spreader of the two heat spreaders has at least one post proximate a first end of the semiconductor die, and a second heat spreader of the two heat spreaders has at least one post proximate a second, opposite end of the semiconductor die.

54. The semiconductor device package of claim 53, wherein each of the two heat spreaders substantially covers the attached portion of one of the opposing major external surfaces of the semiconductor die.

55. The semiconductor device package of claim 54, wherein at least one of the two heat spreaders is configured for connection to a ground conductor on the substrate.

56. The semiconductor device package of claim 55, wherein the semiconductor die comprises a vertical mount plastic-encapsulated package.

57. The semiconductor device package of claim 56, wherein the register apparatus on the at least one peripheral edge of each of the two heat spreaders is configured for machine positioning and attachment of each heat spreader on one of the opposing major external surfaces of the package.

58. The semiconductor device package of claim 57, wherein the register apparatus on the at least one peripheral edge of each of the two heat spreaders comprises cutout portions of each of the two heat spreaders.

59. The semiconductor device package of claim 51, wherein the two heat spreaders are attached to the package with an adhesive.

60. The semiconductor device package of claim 51, wherein the two heat spreaders are attached to the package with an adhesive-coated tape.

61. The semiconductor device package of claim 51, wherein the two heat spreaders comprise plates, the plates including metal, ceramic material, and plastic material.

62. The semiconductor device package of claim 51, further comprising:

a layer of material encapsulating the two heat spreaders within the package.

* * * * *

UNITED STATES PATENT AND TRADEMARK OFFICE
CERTIFICATE OF CORRECTION

PATENT NO. : 6,765,291 B2  Page 1 of 1
APPLICATION NO. : 10/219118
DATED : July 20, 2004
INVENTOR(S) : David J. Corisis It is certified that error appears in the above-identified patent and that said Letters Patent is hereby corrected as shown below:

On the title page:
Item (62) "Related U.S. Application Data", 2nd line,    after "2001," insert --now U.S. Pat. No. 6,518,098,--

In the specification:
  COLUMN 1, LINE 21, change "water" to --wafer--
  COLUMN 1, LINE 33, change "discrete IC" to --discrete dice. The discrete IC--
  COLUMN 2, LINE 61, change "as if taken" to --as taken--

In the claims:
CLAIM 32, COLUMN 9, LINE 50, change "material encapsulating" to --a material encapsulating--

Signed and Sealed this

Sixth Day of November, 2007

JON W. DUDAS
*Director of the United States Patent and Trademark Office*